(12) United States Patent
Dan (10) Patent No.: US 11,252,824 B2
(45) Date of Patent: Feb. 15, 2022

(54) METHOD FOR FABRICATING PRINTED CIRCUIT BOARD AND PRINTED CIRCUIT BOARD FABRICATED THEREBY

(71) Applicant: AMOGREENTECH CO., LTD., Gimpo-si (KR)

(72) Inventor: Sung-Baek Dan, Hwaseong-si (KR)

(73) Assignee: AMOGREENTECH CO., LTD., Gimpo-si (KR)

(*) Notice: Subject to any disclaimer, the term of this patent is extended or adjusted under 35 U.S.C. 154(b) by 6 days.

(21) Appl. No.: 16/755,556

(22) PCT Filed: Oct. 12, 2018

(86) PCT No.: PCT/KR2018/012013
§ 371 (c)(1),
(2) Date: Apr. 10, 2020

(87) PCT Pub. No.: WO2019/074312
PCT Pub. Date: Apr. 18, 2019

(65) Prior Publication Data
US 2021/0195762 A1 Jun. 24, 2021

(30) Foreign Application Priority Data
Oct. 12, 2017 (KR) .................. 10-2017-0132524

(51) Int. Cl.
*H05K 1/00* (2006.01)
*H05K 1/02* (2006.01)
(Continued)

(52) U.S. Cl.
CPC ......... *H05K 3/4644* (2013.01); *H05K 1/0313* (2013.01); *H05K 1/09* (2013.01);
(Continued)

(58) Field of Classification Search
CPC .. H05K 1/00; H05K 1/02; H05K 1/03; H05K 1/05; H05K 1/09; H05K 1/11; H05K 1/16;
(Continued)

(56) References Cited

U.S. PATENT DOCUMENTS 9,042,113 B2  5/2015  Kim
9,629,260 B2  4/2017  Park et al.
(Continued)

FOREIGN PATENT DOCUMENTS

KR   10-2013-0057314 A   5/2013
KR     10-1321305 B1    10/2013
(Continued)

*Primary Examiner* — Xiaoliang Chen
(74) *Attorney, Agent, or Firm* — Maschoff Brennan (57) ABSTRACT

Disclosed are a method for fabricating a printed circuit board wherein through-holes are formed in an organic substrate, followed by forming micro-circuit patterns through sputtering and plating, whereby the printed circuit board has low permittivity properties and enables high-speed processing, and a printed circuit board fabricated thereby. The disclosed method for fabricating a printed circuit board comprises the steps of: preparing a base substrate; forming a through-hole perforating the base substrate; forming a thin seed layer on the base substrate and in the through-hole; forming a thin plate layer on the thin seed layer; and etching the thin seed layer and the thin plate layer to form a micro-circuit pattern, wherein the base substrate is one selected from an organic substrate, FR-4, and Prepreg.

6 Claims, 10 Drawing Sheets

(51) Int. Cl.
| | |
|---|---|
| *H05K 1/03* | (2006.01) |
| *H05K 1/05* | (2006.01) |
| *H05K 1/09* | (2006.01) |
| *H05K 1/11* | (2006.01) |
| *H05K 1/16* | (2006.01) |
| *H05K 1/18* | (2006.01) |
| *H05K 3/00* | (2006.01) |
| *H05K 3/02* | (2006.01) |
| *H05K 3/06* | (2006.01) |
| *H05K 3/10* | (2006.01) |
| *H05K 3/30* | (2006.01) |
| *H05K 3/36* | (2006.01) |
| *H05K 3/38* | (2006.01) |
| *H05K 3/40* | (2006.01) |
| *H05K 3/42* | (2006.01) |
| *H05K 3/44* | (2006.01) |
| *H05K 3/46* | (2006.01) |

(52) U.S. Cl.
CPC ........... *H05K 1/116* (2013.01); *H05K 3/0011* (2013.01); *H05K 3/06* (2013.01); *H05K 3/42* (2013.01); *H05K 2203/0502* (2013.01)

(58) Field of Classification Search
CPC .. H05K 1/18; H05K 3/00; H05K 3/02; H05K 3/06; H05K 3/10; H05K 3/30; H05K 3/36; H05K 3/38; H05K 3/40; H05K 3/42; H05K 3/44; H05K 3/46; H05K 3/52
USPC ....... 174/258, 250, 251, 254, 255, 257, 260, 174/262, 264, 266; 29/745, 829, 830, 29/846, 852; 361/688, 792; 428/209, 428/626
See application file for complete search history.

(56) References Cited

U.S. PATENT DOCUMENTS

| | | | | |
|---|---|---|---|---|
| 10,978,383 | B2* | 4/2021 | Shimizu | H01L 23/49822 |
| 2001/0002625 | A1* | 6/2001 | Fujii | H05K 3/426 |
| | | | | 174/262 |
| 2004/0150969 | A1* | 8/2004 | Chan | H01L 23/5383 |
| | | | | 361/792 |
| 2004/0238215 | A1* | 12/2004 | Ho | H05K 3/4652 |
| | | | | 174/262 |
| 2005/0039950 | A1* | 2/2005 | Chan | H05K 3/4688 |
| | | | | 174/262 |
| 2005/0064159 | A1* | 3/2005 | Amou | H05K 1/032 |
| | | | | 428/209 |
| 2006/0060558 | A1* | 3/2006 | Maeng | H05K 3/4661 |
| | | | | 216/13 |
| 2006/0193970 | A1* | 8/2006 | Myung | C23C 26/00 |
| | | | | 427/96.1 |
| 2006/0244134 | A1* | 11/2006 | Inagaki | H01L 24/81 |
| | | | | 257/734 |
| 2007/0029106 | A1* | 2/2007 | Kato | H01L 23/49838 |
| | | | | 174/255 |
| 2007/0246253 | A1* | 10/2007 | Yakabe | H01L 21/486 |
| | | | | 174/264 |
| 2007/0261234 | A1* | 11/2007 | Song | H05K 3/381 |
| | | | | 29/829 |
| 2008/0000681 | A1* | 1/2008 | Nakamura | H05K 1/0251 |
| | | | | 174/262 |
| 2009/0000812 | A1* | 1/2009 | Kariya | H05K 1/113 |
| | | | | 174/260 |
| 2009/0014205 | A1* | 1/2009 | Kobayashi | H05K 3/4691 |
| | | | | 174/255 |
| 2009/0056998 | A1* | 3/2009 | Booth, Jr | H05K 1/0222 |
| | | | | 174/262 |
| 2009/0094824 | A1* | 4/2009 | Iida | H05K 3/4608 |
| | | | | 29/846 |
| 2009/0095509 | A1* | 4/2009 | Hirano | H05K 1/115 |
| | | | | 174/250 |
| 2009/0095511 | A1* | 4/2009 | Iida | H05K 3/4608 |
| | | | | 174/255 |
| 2009/0095524 | A1* | 4/2009 | Iida | H05K 3/4608 |
| | | | | 174/667 |
| 2009/0098478 | A1* | 4/2009 | Ryu | H05K 3/4658 |
| | | | | 430/258 |
| 2009/0314532 | A1* | 12/2009 | Hayashi | C08L 63/00 |
| | | | | 174/258 |
| 2010/0294544 | A1* | 11/2010 | Momota | H05K 3/4691 |
| | | | | 174/254 |
| 2011/0290408 | A1* | 12/2011 | Samejima | H05K 3/462 |
| | | | | 156/182 |
| 2012/0043128 | A1* | 2/2012 | Yoon | H05K 3/429 |
| | | | | 174/266 |
| 2012/0097442 | A1* | 4/2012 | Yoshimura | B29C 70/545 |
| | | | | 174/262 |
| 2012/0292085 | A1* | 11/2012 | Watanabe | H05K 1/024 |
| | | | | 174/254 |
| 2013/0133926 | A1 | 5/2013 | Kim et al. | |
| 2013/0206460 | A1* | 8/2013 | Mochizuki | H05K 1/056 |
| | | | | 174/255 |
| 2014/0027163 | A1* | 1/2014 | Min | H05K 3/4605 |
| | | | | 174/257 |
| 2014/0311772 | A1* | 10/2014 | Mizutani | H05K 3/462 |
| | | | | 174/251 |
| 2015/0208514 | A1* | 7/2015 | Thomas | H05K 3/429 |
| | | | | 205/125 |
| 2015/0257261 | A1* | 9/2015 | Kitagawa | H01L 23/49827 |
| | | | | 361/688 |
| 2015/0271917 | A1* | 9/2015 | Choi | H05K 3/429 |
| | | | | 174/251 |
| 2015/0282297 | A1 | 10/2015 | Choi et al. | |
| 2016/0021762 | A1* | 1/2016 | Kallman | C25D 5/02 |
| | | | | 174/266 |
| 2018/0002485 | A1* | 1/2018 | Tanigawa | H05K 1/036 |

FOREIGN PATENT DOCUMENTS

| | | |
|---|---|---|
| KR | 10-2014-0137701 A | 12/2014 |
| KR | 10-2015-0094795 A | 8/2015 |
| KR | 10-2016-0064386 A | 6/2016 |

* cited by examiner

METHOD FOR FABRICATING PRINTED CIRCUIT BOARD AND PRINTED CIRCUIT BOARD FABRICATED THEREBY

TECHNICAL FIELD

The present disclosure relates to a method for fabricating a printed circuit board and a printed circuit board fabricated thereby, and more particularly, to a method for fabricating a printed circuit board and a printed circuit board fabricated thereby, which enable a high speed processing with low permittivity characteristics for use as a circuit using a high frequency.

BACKGROUND ART

A printed circuit board is a board on which various types of many electronic components are mounted, and circuit patterns which connect the respective electronic components are formed.

The printed circuit board is classified into a flexible printed circuit board and a rigid printed circuit board.

The flexible printed circuit board is a board which has flexibility by closely contacting or adhering copper to a base film made of a polyimide material. The rigid printed circuit board is a board which has rigidity by adhering copper to the base substrates such as epoxy and phenol.

Recently, a high density and highly integrated printed circuit board technology for ultra-high speed communication is required. In addition, as the light weight and short size and emotional design of a portable device are required, a printed circuit board technology is also required to be miniaturized, light weight, thin, highly functional, and various design correspondences.

DISCLOSURE

Technical Problem

The present disclosure has been proposed in consideration of the above circumstances, and an object of the present disclosure is to provide a method for fabricating a printed circuit board and a printed circuit board fabricated thereby, which form a through-hole in an organic substrate and then form a micro-circuit pattern through sputtering and plating, thereby enabling a high-speed processing with low permittivity characteristics.

Technical Solution

For achieving the object, a method for fabricating a printed circuit board according to an embodiment of the present disclosure includes preparing a base substrate, forming a through-hole penetrating through the base substrate, forming a thin seed layer on the base substrate and in the through-hole, forming a thin plate layer on the thin seed layer, and etching the thin seed layer and the thin plate layer to form a micro-circuit pattern, and the base substrate is one selected from an organic substrate, FR-4, and Prepreg.

For achieving the object, a method for fabricating a printed circuit board according to another embodiment of the present disclosure includes preparing a base substrate, forming a laminate by laminating a plurality of base substrates, bonding the laminate, forming a through-hole penetrating through the laminate, and forming a connection plate layer on the laminate and the through-hole, and the base substrate is one selected from an organic substrate, FR-4, and Prepreg.

For achieving the object, a printed circuit board according to an embodiment of the present disclosure includes a base substrate and a micro-circuit pattern which is formed on at least one surface of the upper surface and the lower surface of the base substrate, and the base substrate is one selected from an organic substrate, FR-4, and Prepreg.

For achieving the object, a printed circuit board according to another embodiment of the present disclosure includes a laminate in which a plurality of base sheets are laminated, a through-hole penetrating through the laminate, and a connection plate layer which is formed on the laminate and the through-hole, and is connected to a micro-circuit pattern which is disposed on the laminate, and the base substrate is one selected from an organic substrate, FR-4, and Prepreg.

Advantageous Effects

According to the present disclosure, the method for fabricating the printed circuit board and the printed circuit board fabricated thereby may form the through-hole in the organic substrate and then form the micro-circuit pattern through sputtering and plating, thereby fabricating the thin film hard type printed circuit board with the low Coefficient of Thermal Expansion (CTE).

In addition, the method for fabricating the printed circuit board and the printed circuit board fabricated thereby may form the through-hole in the organic substrate and then form the micro-circuit pattern through sputtering and plating, thereby enabling the low permittivity and high speed processing to implement the high clock and the narrow line width.

In addition, the method for fabricating the printed circuit board and the printed circuit board fabricated thereby may configure, as the base substrate, the FR-4 or the Prepreg which includes the coating layer formed on the surface thereof, thereby preventing the occurrence of the outgassing, in which the impurity gases in the printed circuit board due to environmental changes such as depressurization and heating during the fabricating process are desorbed or outgassed.

In addition, the method for fabricating the printed circuit board and the printed circuit board fabricated thereby may configure, as the base substrate, the FR-4 or the Prepreg which includes the coating layer formed on the surface thereof to prevent the occurrence of the outgassing, thereby preventing degradation of the physical properties of the printed circuit board, and minimizing the occurrence of defects.

BEST MODE

Hereinafter, the most preferred embodiment of the present disclosure will be described with reference to the accompanying drawings in order to specifically describe so that those skilled in the art to which the present disclosure pertains may easily practice the technical spirit of the present disclosure. First, in adding reference numerals to the components of each drawing, it should be noted that the same components are denoted by the same reference numerals as much as possible even if displayed on different drawings. In addition, in describing the present disclosure, when it is determined that the detailed description of the related known configuration or function may obscure the gist of the present disclosure, the detailed description thereof will be omitted.

A method for fabricating a printed circuit board according to an embodiment of the present disclosure is a method for fabricating a thin film hard type printed circuit board using a high frequency, and an object of the present disclosure is to enable a high speed processing with low permittivity characteristics.

Figure 1:
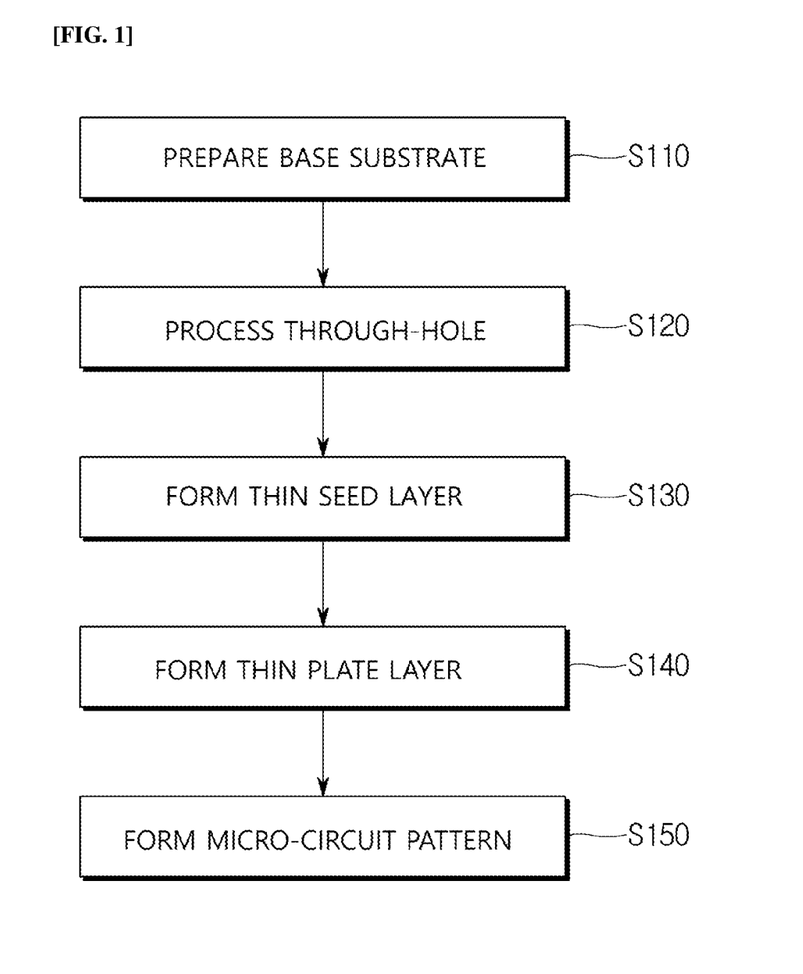
FIGS. 1 and 2 are diagrams for explaining a method for fabricating a printed circuit board according to a first embodiment of the present disclosure.
Figure 2:
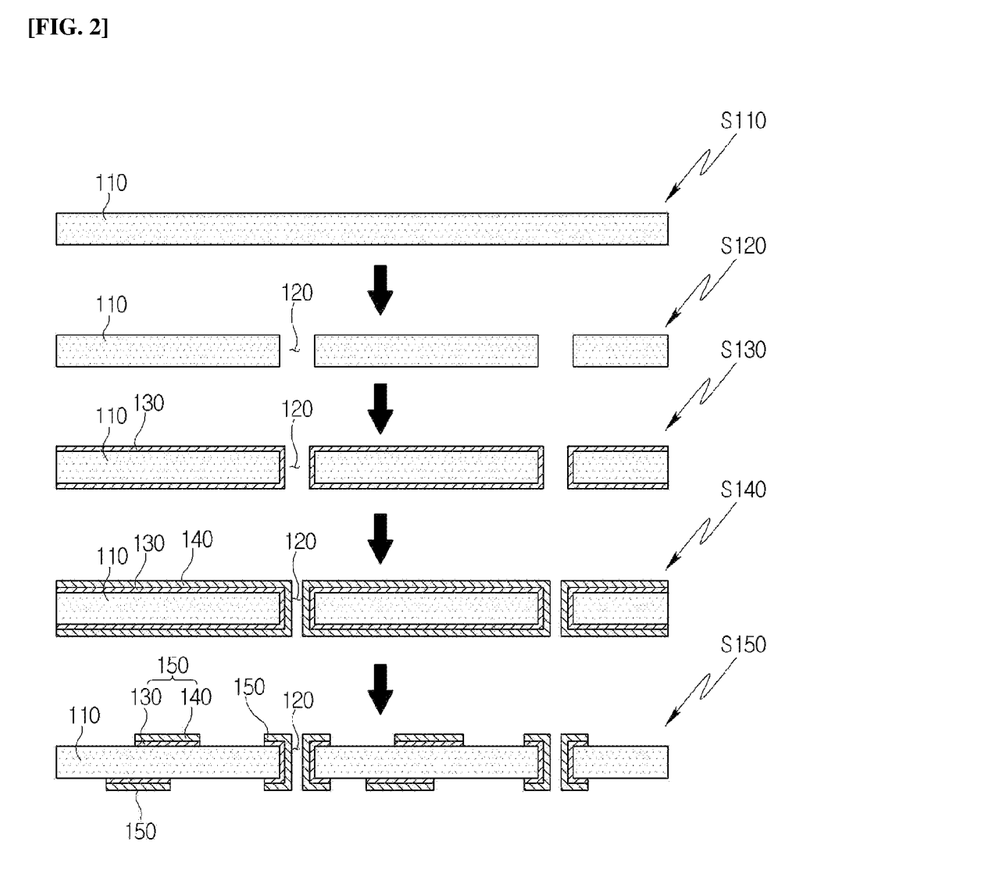

Referring to FIGS. 1 and 2, a method for fabricating a printed circuit board according to a first embodiment of the present disclosure includes preparing a base substrate (S110), processing a through-hole (S120), forming a thin seed layer (S130), forming a thin plate layer (S140), and forming a micro-circuit pattern (S150).

The preparing of the base substrate (S110) prepares an organic substrate as the base substrate 110. The organic substrate has a low Coefficient of Thermal Expansion (CTE), and enables a low permittivity and high speed processing, thereby implementing a high clock and a narrow line width.

The preparing of the base substrate (S110) may prepare, as the base substrate 110, the organic substrate, which is a thermoplastic resin in the form of a film or a sheet. The thermoplastic resin is, for example, epoxy, polyimide, polycarbonate, polyvinyl alcohol, or the like.

The organic substrate may also be a laminated film in which one or more thermoplastic resin films are laminated. The laminated film may include a PET film, a resin composition layer which is formed on the upper surface of the PET film, and an OPP film which is formed on the lower surface of the PET film. The laminated film is, for example, an Ajinomoto Build-up Film (ABF) fabricated by Ajinomoto Fine Techno Co., Inc.

Figure 3:
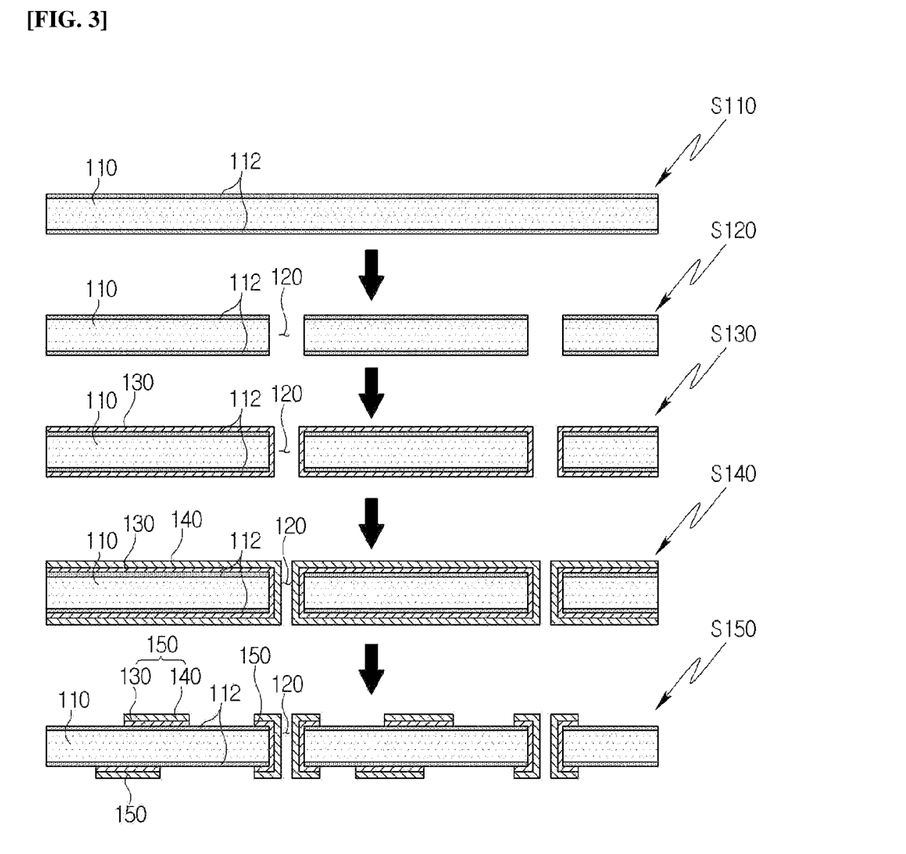
FIG. 3 is a diagram for explaining preparing a base substrate of FIG. 1.

Referring to FIG. 3, the preparing of the base substrate (S110) may also prepare FR-4 or Prepreg as the base substrate 110.

The FR-4 or the Prepreg is commonly used as the base substrate 110 of the printed circuit board. The FR-4 or the Prepreg is outgassed by environmental changes such as depressurization and heating during the fabricating process.

The outgassing is a phenomenon in which the impurity gases in the board are desorbed or outgassed during the process, which degrades the physical properties of the printed circuit board.

Accordingly, the preparing of the base substrate (S110) forms a coating layer 112 on the surface of the base substrate 110. The coating layer 112 is formed on the upper surface and the lower surface of the base substrate 110. The coating layer 112 may also be formed on the side surfaces of the base substrate 110. The coating layer 112 is, for example, made of polyimide (PI), polyamide-imide (PAI), or the like.

The processing of the through-hole (S120) forms one or more through-holes 120 which perforate the base substrate 110. The through-hole 120 may be formed through a punching process.

The forming of the thin seed layer (S130) forms the thin seed layer 130 on the base substrate 110 on which the through-holes 120 are formed. The thin seed layer 130 may be formed on at least one surface of the upper surface and the lower surface of the base substrate 110 and the inner wall surface of the through-hole 120. The thin seed layer 130 may be formed through a deposition process or a sputtering process. The thin seed layer 130 may be made of one of nickel copper (NiCu) and copper (Cu), or a mixed material which mixes nickel copper (NiCu) and copper (Cu).

The forming of the thin plate layer (S140) forms a thin plate layer 140 on the thin seed layer 130. The thin plate layer 140 may be formed on the surface of the thin seed layer 130 through a process such as electroplating or electroless plating. The thin plate layer 140 is, for example, copper (Cu).

The forming of the micro-circuit pattern (S150) forms a circuit pattern having a fine line width (that is, a micro-circuit pattern 150) on at least one surface of the upper surface and the lower surface of the base substrate 110. The micro-circuit pattern 150 may be formed by partially removing the thin seed layer 130 and the thin plate layer 140 which are formed on the base substrate 110 through an etching process. The etching process may include a masking process and an etching process.

Meanwhile, the method for fabricating the printed circuit board may further include forming a protective layer.

The forming of the protective layer forms a protective layer on the surfaces (that is, the upper surface and the lower surface) of the printed circuit board on which the micro-circuit pattern 150 is formed.

The protective layer may be formed by applying and then curing a liquid coating solution on the surfaces (that is, the upper surface and the lower surface) of the printed circuit board. The protective layer may protect by covering the surface of the printed circuit board (that is, the micro-circuit pattern 150 and the base substrate 110).

The protective layer may be formed by applying and curing a coating liquid of the same series as that of the base substrate 110. The protective layer is, for example, an organic substrate such as epoxy, polyimide, polycarbonate, or polyvinyl alcohol. Accordingly, the protective layer may be more firmly integrated with the base substrate 110 because of an excellent adhesive force with the base substrate 110.

In addition, the method for fabricating the printed circuit board may further include forming a terminal part. The forming of the terminal part may form a terminal part by removing a part of the protective layer and then plating a conductive material such as copper on the corresponding region.

Figure 4:
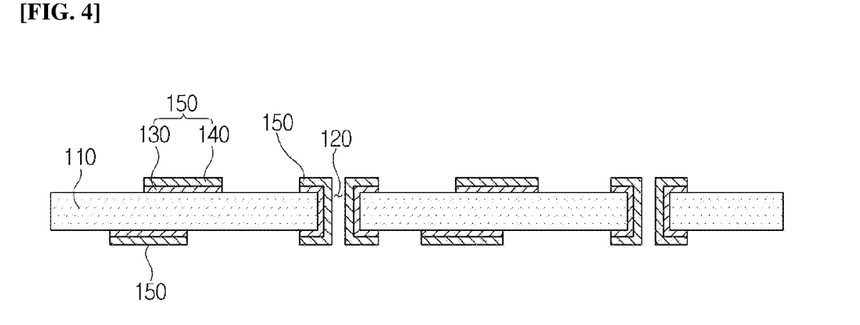
FIGS. 4 and 5 are diagrams for explaining the printed circuit board according to the first embodiment of the present disclosure.

Referring to FIG. 4, the printed circuit board according to the first embodiment of the present disclosure is configured to include the base substrate 110, and the micro-circuit pattern 150 which is formed on the base substrate 110.

The base substrate 110 is composed of an organic substrate. The organic substrate has a low Coefficient of Thermal Expansion (CTE), and enables a low permittivity and high speed processing, thereby implementing a high clock and a narrow line width.

The organic substrate may be a thermoplastic resin in the form of a film or a sheet. The thermoplastic resin is, for example, epoxy, polyimide, polycarbonate, polyvinyl alcohol, or the like.

The organic substrate may also be a laminated film in which one or more thermoplastic resin films are laminated. The laminated film may include a PET film, a resin composition layer which is formed on the upper surface of the PET film, and an OPP film which is formed on the lower surface of the PET film. The laminated film is, for example, an Ajinomoto Build-up Film (ABF) fabricated by Ajinomoto Fine Techno Co., Inc.

Figure 5:
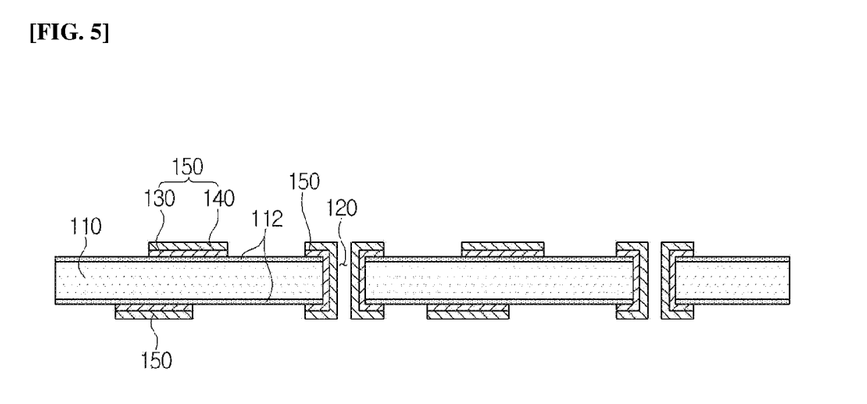

Referring to FIG. 5, the base substrate 110 may also be composed of FR-4 or Prepreg. The FR-4 or the Prepreg is commonly used as the base substrate 110 of the printed circuit board. The FR-4 or the Prepreg is outgassed by environmental changes such as depressurization and heating during the fabricating process.

The outgassing is a phenomenon in which the impurity gases in the board are desorbed or outgassed during the process, which degrades the physical properties of the printed circuit board.

Accordingly, the base substrate 110 may include the coating layer 112. The coating layer 112 is formed on the surface of the base substrate 110. The coating layer 112 is formed on the upper surface and the lower surface of a FR-4 board (or film, sheet) or a Prepreg board (or film, sheet). The coating layer 112 may also be formed on the side surfaces of the FR-4 board (or film, sheet) or the Prepreg board (or film, sheet). The coating layer 112 is, for example, made of polyimide (PI), polyamide-imide (PAI), or the like.

The micro-circuit pattern 150 is formed on at least one surface of the upper surface and the lower surface of the base substrate 110. When the micro-circuit pattern 150 is formed on the upper surface and the lower surface of the base substrate 110, one or more through-holes 120 may be formed in the base substrate 110. The through-hole 120 perforates the base substrate 110, and is formed on the upper surface and the lower surface of the entire region of the base substrate 110 by penetrating the region where the micro-circuit pattern 150 is formed.

The micro-circuit pattern 150 may include the thin seed layer 130. The thin seed layer 130 is formed on the base substrate 110 in which the through-hole 120 is formed. The thin seed layer 130 may be formed on at least one surface of the upper surface and the lower surface of the base substrate 110 and the inner wall surface of the through-hole 120. The thin seed layer 130 may be made of one of nickel copper (NiCu) and copper (Cu), or a mixed material which mixes nickel copper (NiCu) and copper (Cu).

The micro-circuit pattern 150 may further include the thin plate layer 140. The thin plate layer 140 is formed on the thin seed layer 130. The thin plate layer 140 is formed on the surface of the thin seed layer 130, and is, for example, copper (Cu).

The printed circuit board may further include a protective layer (not illustrated). The protective layer is formed on the surfaces (that is, the upper surface and the lower surface of the base substrate 110) of the printed circuit board. The protective layer is, for example, an organic substrate such as epoxy, polyimide, polycarbonate, or polyvinyl alcohol.

The printed circuit board may further include a terminal part (not illustrated). The terminal part is formed on the printed circuit board after partially removing the protective layer. The terminal part is a configuration for connecting the micro-circuit pattern 150 to an external circuit, and is, for example, a conductive material such as copper.

Figure 6:
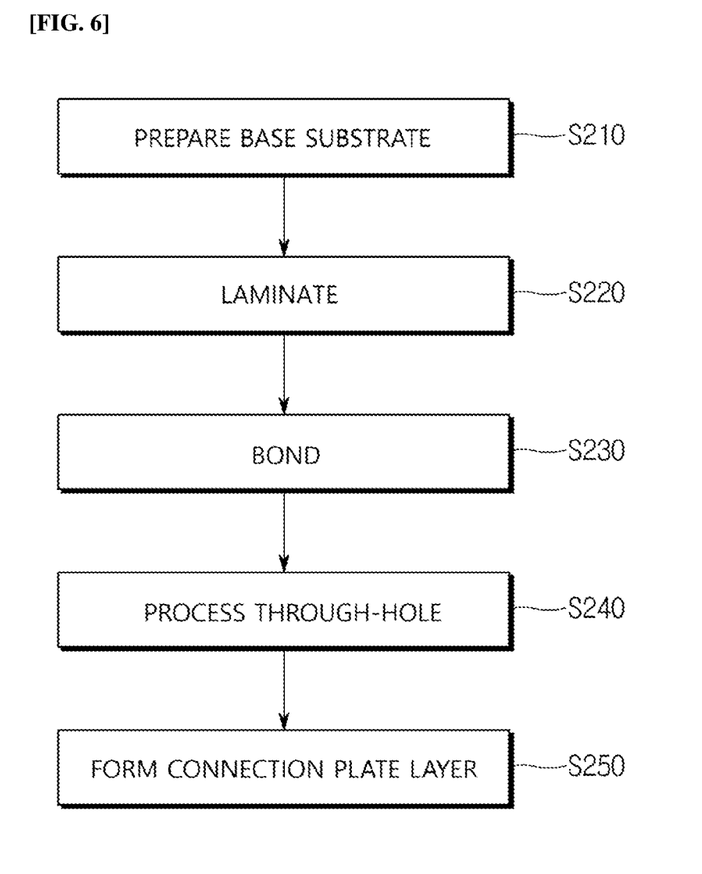
FIGS. 6 and 7 are diagrams for explaining a method for fabricating a printed circuit board according to a second embodiment of the present disclosure.
Figure 7:
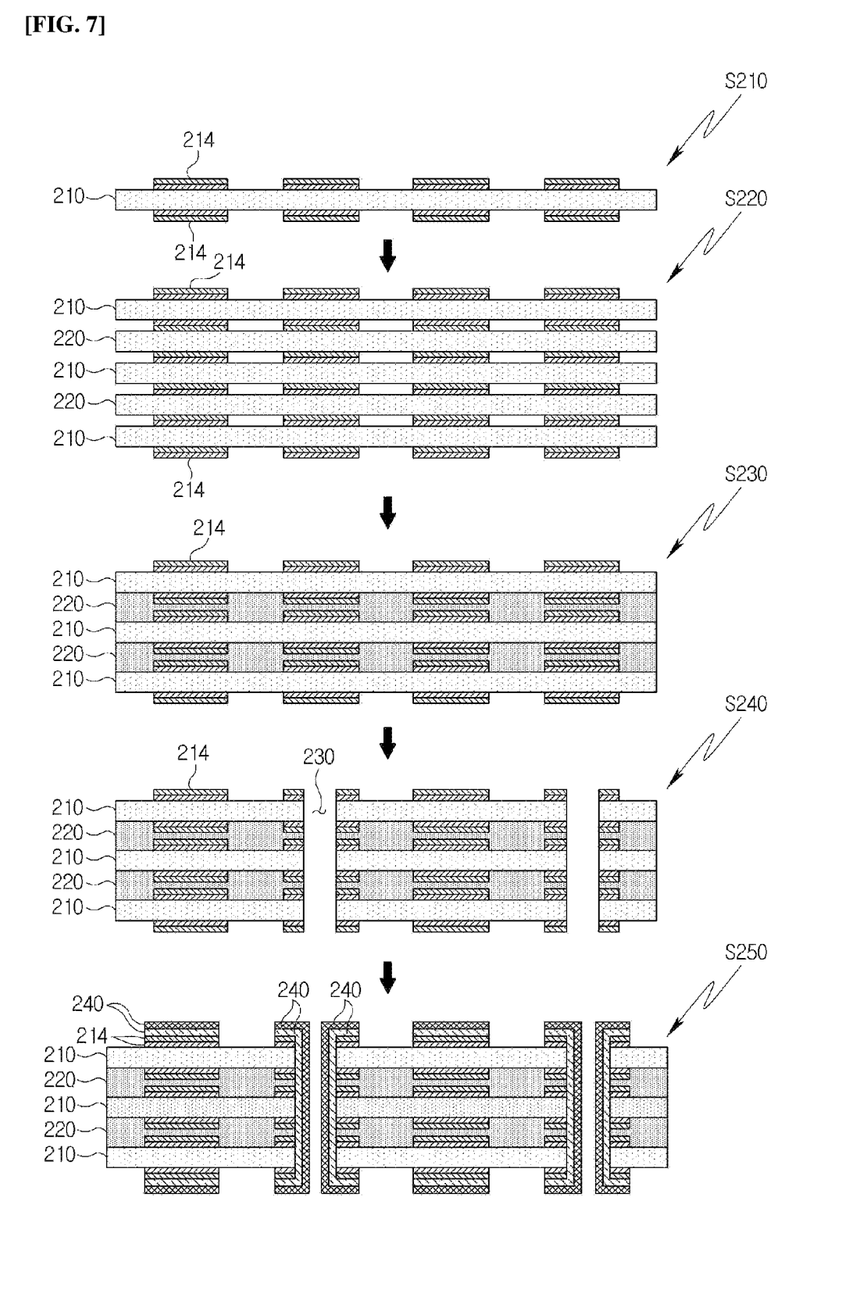

Referring to FIGS. 6 and 7, a method for fabricating a printed circuit board according to a second embodiment of the present disclosure includes preparing a base substrate (S210), laminating (S220), bonding (S230), and processing a through-hole (S240), and forming a connection plate layer (S250).

The preparing of the base substrate (S210) prepares an organic substrate as a base substrate 210. The organic substrate has a low Coefficient of Thermal Expansion (CTE), and enables a low permittivity and high speed processing, thereby implementing a high clock and a narrow line width.

The preparing of the base substrate (S210) may prepare, as the base substrate 210, an organic substrate, which is a thermoplastic resin in the form of a film or a sheet. The thermoplastic resin is, for example, epoxy, polyimide, polycarbonate, polyvinyl alcohol, or the like.

The organic substrate may also be a laminated film in which one or more thermoplastic resin films are laminated. The laminated film may include a PET film, a resin composition layer which is formed on the upper surface of the PET film, and an OPP film which is formed on the lower surface of the PET film. The laminated film is, for example, an Ajinomoto Build-up Film (ABF) fabricated by Ajinomoto Fine Techno Co., Inc.

Figure 8:
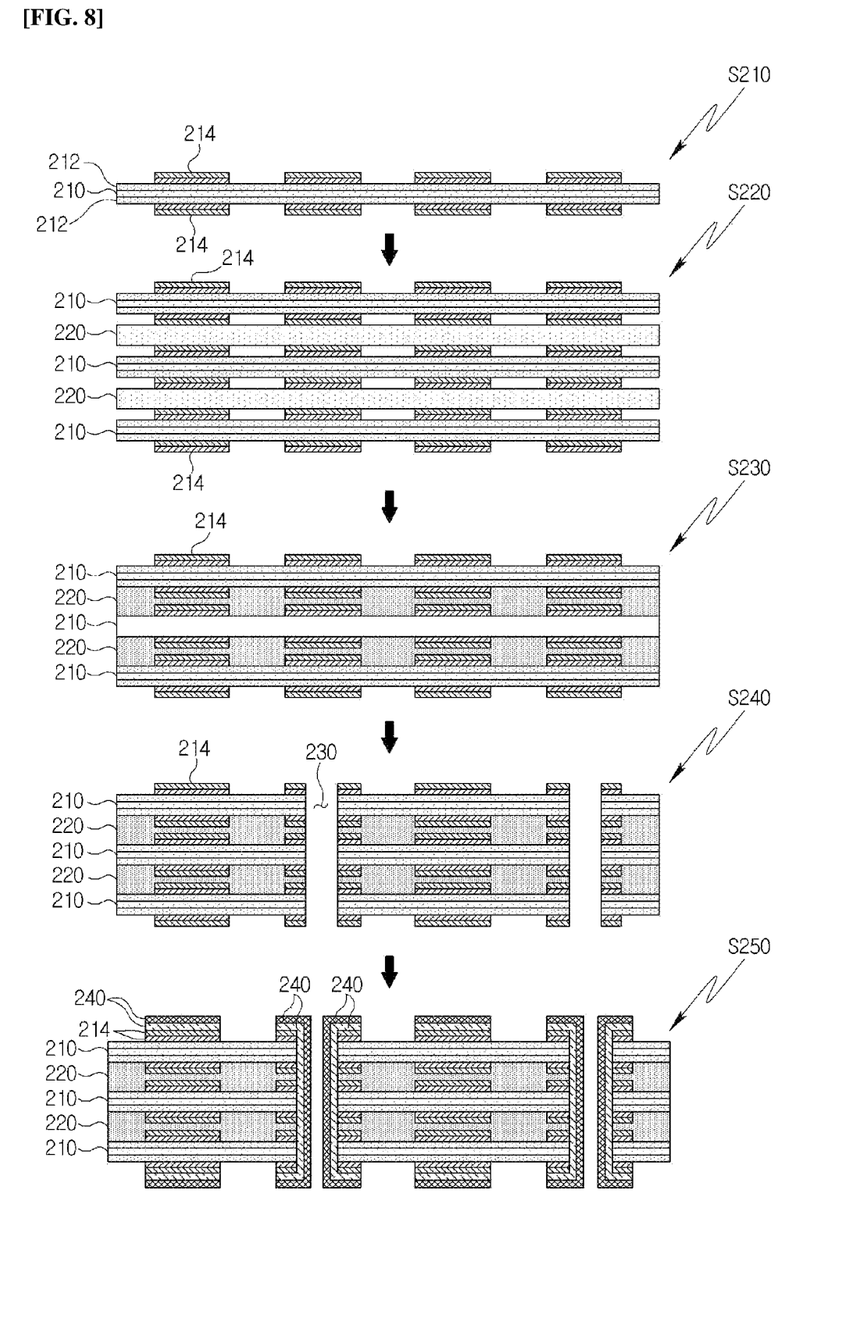
FIGS. 8 to 10 are diagrams for explaining preparing a base substrate of FIG. 6.

Referring to FIG. 8, the preparing of the base substrate (S210) may also prepare FR-4 or Prepreg as the base substrate 210.

The FR-4 or the Prepreg is commonly used as the base substrate 210 of the printed circuit board. The FR-4 or the Prepreg is outgassed by environmental changes such as depressurization and heating during the fabricating process.

The outgassing is a phenomenon in which the impurity gases in the board are desorbed or outgassed during the process, which degrades the physical properties of the printed circuit board.

Accordingly, the preparing of the base substrate (S210) forms a coating layer 212 on the surface of the base substrate 210. The coating layer 212 is formed on the upper surface and the lower surface of the base substrate 210. The coating layer 212 may also be formed on the side surfaces of the base substrate 210. The coating layer 212 is, for example, made of polyimide (PI), polyamide-imide (PAI), or the like.

The preparing of the base substrate (S210) prepares the base substrate 210 on which the micro-circuit pattern 214 is formed.

Figure 9:
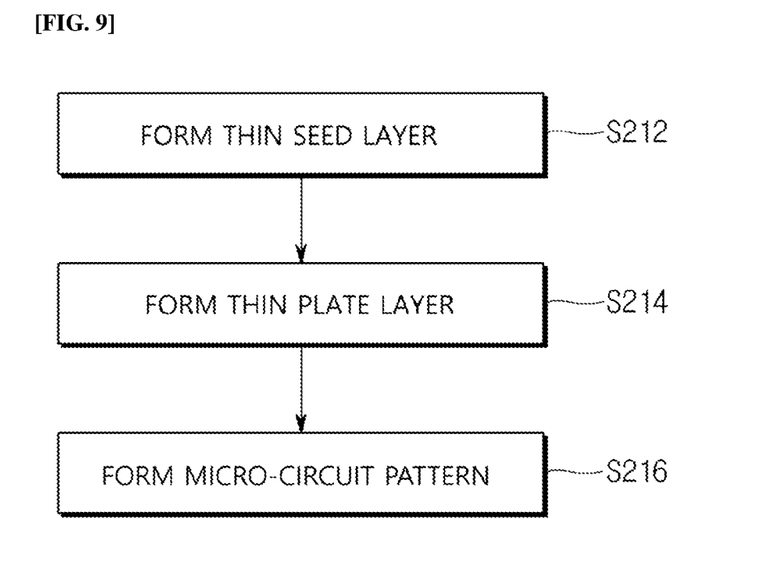
Figure 10:
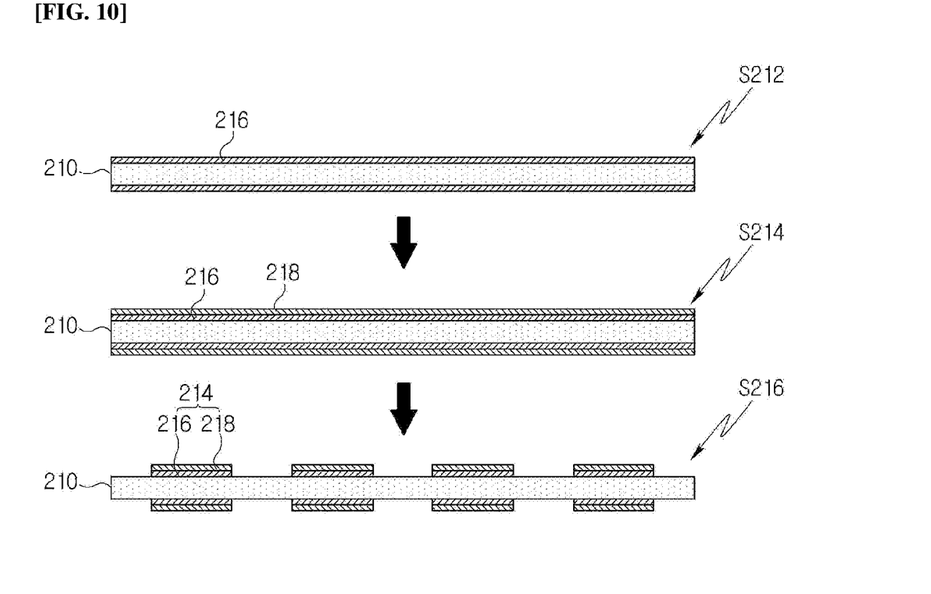

Referring to FIGS. 9 and 10, the preparing of the base substrate (S210) may include forming a thin seed layer (S212), forming a thin plate layer (S214), and forming a micro-circuit pattern (S216).

The forming of the thin seed layer (S212) forms a thin seed layer 216 on the base substrate 210. The thin seed layer 216 may be formed on at least one surface of the upper surface and the lower surface of the base substrate 210. The thin seed layer 216 may be formed through a deposition process or a sputtering process. The thin seed layer 216 may be made of one of nickel copper (NiCu) and copper (Cu), or a mixed material which mixes nickel copper (NiCu) and copper (Cu).

The forming of the thin plate layer (S214) forms a thin plate layer 218 on the thin seed layer 216. The thin plate layer 218 may be formed on the surface of the thin seed layer 216 through a process such as electroplating or electroless plating. The thin plate layer 218 is, for example, copper (Cu).

The forming of the micro-circuit pattern (S216) forms a circuit pattern (that is, a micro-circuit pattern 214) having a fine line width on at least one surface of the upper surface and the lower surface of the base substrate 210. The micro-circuit pattern 214 may be formed by partially removing the thin seed layer 216 and the thin plate layer 218 which are formed on the base substrate 210 through an etching process. The etching process may include a masking process and an etching process.

The laminating (S220) forms a laminate by laminating a plurality of base substrates 210. The laminating (S220) form a laminate by interposing a bonding substrate 220 between the plurality of base substrates 210. The bonding substrate 220 is configured in the form of a film or a sheet. The laminating (S220) may also form the laminate by laminating the plurality of base substrates 210 to which an adhesive agent is applied to the surface.

The bonding (S230) bonds the laminate through a hot pressing (heating pressurization) process. That is, the bonding (S230) bonds the plurality of base sheets by simultaneously heating and pressurizing them with heat of the melting temperature or more of the bonding substrate 220 (or the adhesive agent) through a hot pressing process.

The processing of the through-hole (S240) forms one or more through-holes 230 which perforate the laminate. The through-hole 230 is connected to the plurality of micro-circuit patterns 214 which are formed in the laminate, and is, for example, formed through a punching process.

The forming of the connection plate layer (S250) forms a connection plate layer 240 on the surfaces of the through-hole 230 and the laminate. The connection plate layer 240 is formed on at least one surface of the upper surface and the lower surface of the laminate and the inner wall surface of the through-hole 230 through a plating process. The connection plate layer 240 electrically connects (that is, electrically conducts) the micro-circuit patterns 214 which are formed on the inside and the outside (that is, the surfaces) of the laminate.

Figure 11:
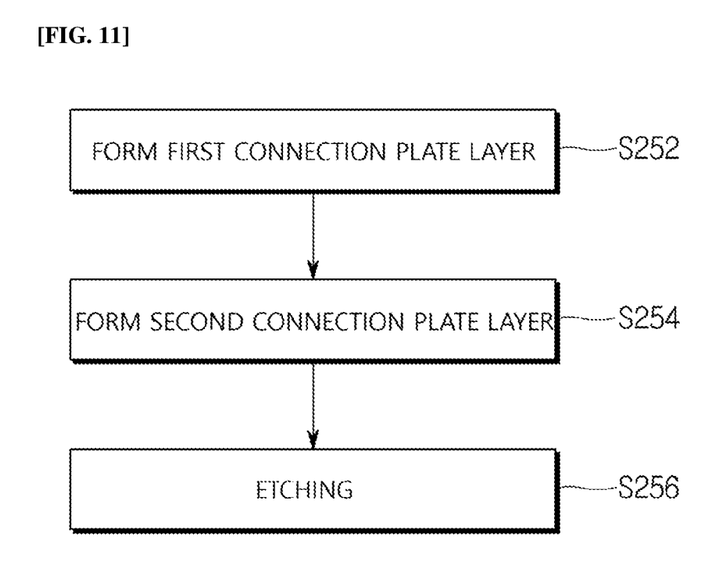
FIG. 11 is a diagram for explaining forming a connection plate layer of FIG. 8.
Figure 12:
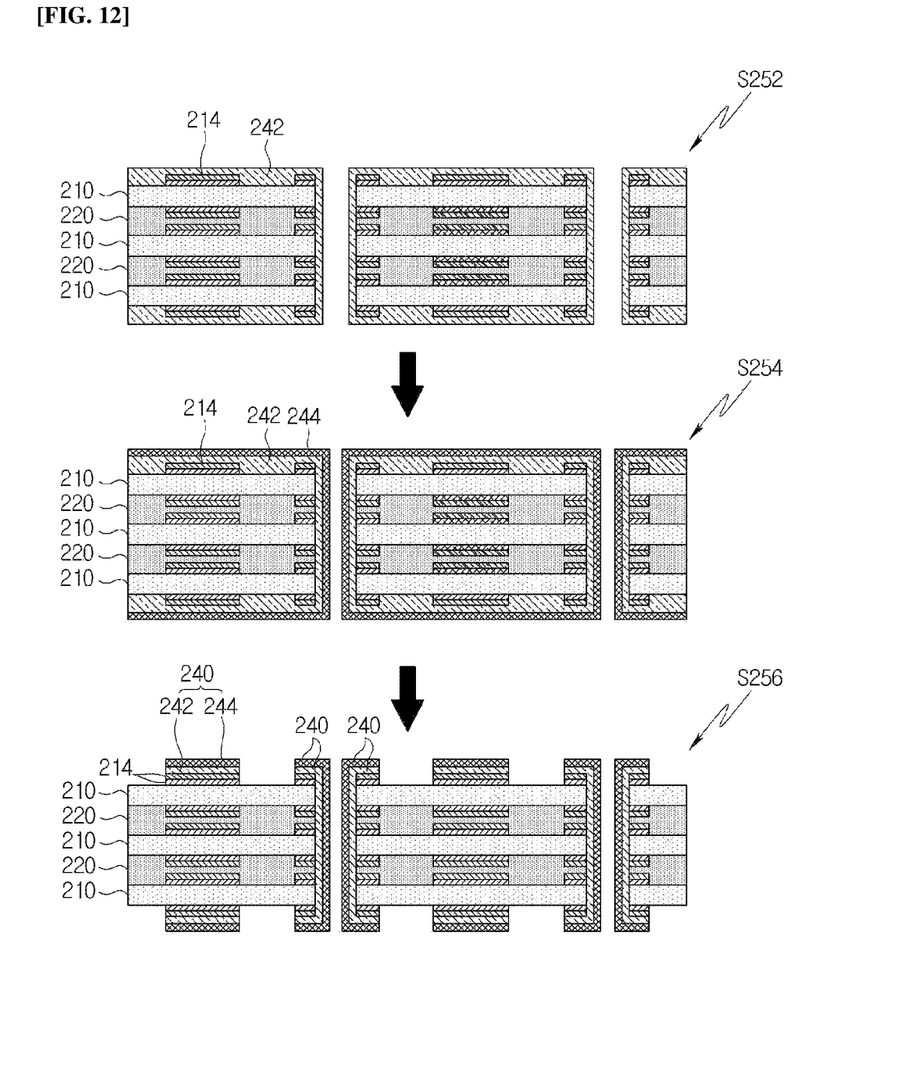
FIGS. 12 to 14 are diagrams for explaining the printed circuit board according to the second embodiment of the present disclosure.

Referring to FIGS. 11 and 12, the forming of the connection plate layer (S250) may include forming a first connection plate layer (S252), forming a second connection plate layer (S254), and etching (S256).

The forming of the first connection plate layer (S252) forms a first connection plate layer 242 on the surface of the laminate and the inner wall surface of the through-hole 230 through a plating process. For example, the forming of the first connection plate layer (S252) forms the first connection plate layer 242 by plating copper (Cu) on the inner wall surface of the through-hole 230, the upper surface of the base substrate 210 which is laminated on the top of the laminate, and the lower surface of the base substrate 210 which is laminated on the bottom of the laminate through a plating process.

The forming of the second connection plate layer (S254) forms a second connection plate layer 244 on the surface of the first connection plate layer 242. The second connection plate layer 244 reinforces the electrical connection (that is, electrical conductivity) of the first connection plate layer 242.

The etching (S256) forms a connection plate layer 240 on the surface of the laminate by etching parts of the first connection plate layer 242 and the second connection plate layer 244.

Meanwhile, the method for fabricating the printed circuit board may further include forming a protective layer.

The forming of the protective layer forms a protective layer on the surfaces (that is, the upper surface and the lower surface) of the laminate in which the micro-circuit pattern 214 is formed.

The protective layer may be formed by applying and then curing a liquid coating solution to the surfaces (that is, the upper surface and the lower surface) of the laminate. The protective layer may protect by covering the surface of the laminate and the external micro-circuit pattern 214.

The protective layer may be formed by applying and curing a coating liquid of the same series as that of the base substrate 210. The protective layer is, for example, an organic substrate such as epoxy, polyimide, polycarbonate, or polyvinyl alcohol. Accordingly, the protective layer may be more firmly integrated with the laminate because of the excellent adhesive force with the base substrate 210.

In addition, the method for fabricating the printed circuit board may further include forming a terminal part. The forming of the terminal part may form a terminal part by removing a part of the protective layer and then plating a conductive material such as copper on the corresponding region.

Although it has been described that the method for fabricating the printed circuit board according to the second embodiment of the present disclosure laminates the plurality of base substrates 210 and then forms the through-hole 230, the present disclosure is not limited thereto and may also laminate after forming the through-hole 230 on each base substrate 210.

Referring to FIG. 12, the printed circuit board according to the second embodiment of the present disclosure is configured to include the laminate in which the plurality of base sheets are laminated, the micro-circuit pattern 214 which is formed on the laminate, and the connection plate layer 240 which connects the micro-circuit pattern 214.

The laminate is configured by laminating the plurality of base sheets. The base substrate 210 is composed of an organic substrate. The organic substrate may have a low Coefficient of Thermal Expansion (CTE), and enables a low permittivity and high speed processing, thereby implementing a high clock and a narrow line width.

The organic substrate may be a thermoplastic resin in the form of a film or a sheet. The thermoplastic resin is, for example, epoxy, polyimide, polycarbonate, polyvinyl alcohol, or the like.

The organic substrate may also be a laminated film in which one or more thermoplastic resin films are laminated. The laminated film may include a PET film, a resin composition layer which is formed on the upper surface of the PET film, and an OPP film which is formed on the lower surface of the PET film. The laminated film is, for example, an Ajinomoto Build-up Film (ABF) fabricated by Ajinomoto Fine Techno Co., Inc.

Figure 13:
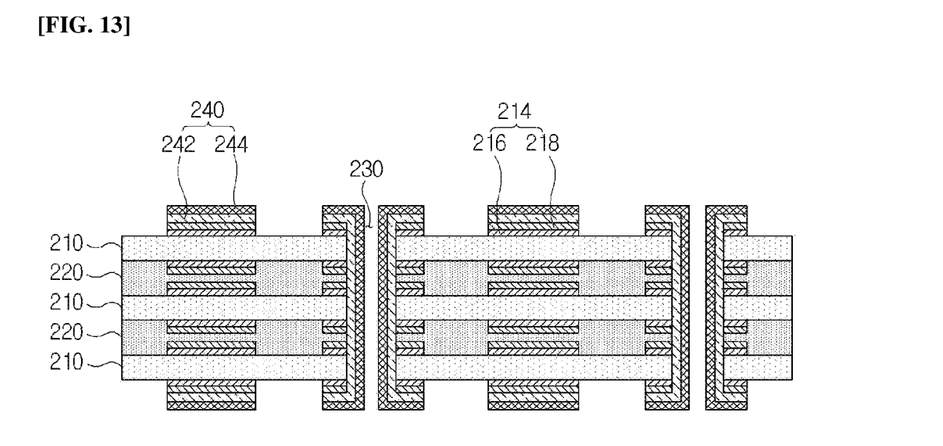

Referring to FIG. 13, the base substrate 210 may also be composed of FR-4 or Prepreg. The FR-4 or the Prepreg is commonly used as the base substrate 210 of the printed circuit board. The FR-4 or the Prepreg is outgassed by environmental changes such as depressurization and heating during the fabricating process.

The outgassing is a phenomenon in which the impurity gases in the board are desorbed or outgassed during the process, which degrades the physical properties of the printed circuit board.

Figure 14:
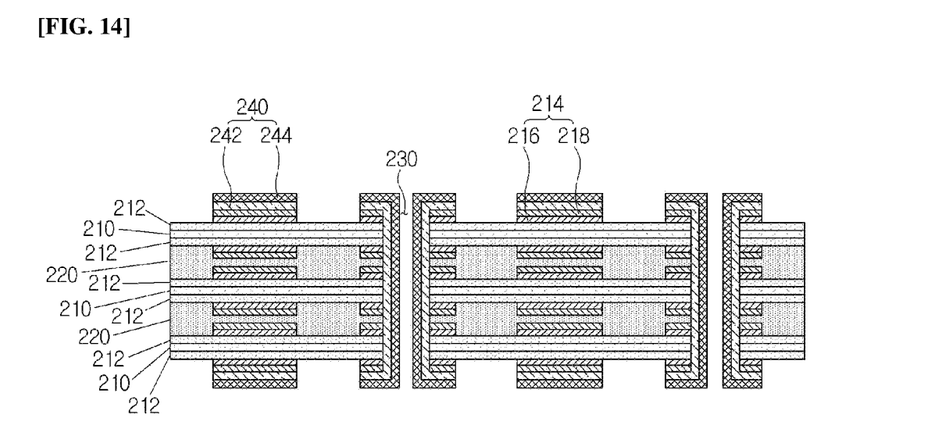

Accordingly, referring to FIG. 14, the base substrate 210 may be a FR-4 board (or film, sheet) or a Prepreg board (or film, sheet) which includes the coating layer 212 formed on the surface thereof. The coating layer 212 is, for example, made of polyimide (PI), polyamide-imide (PAI), or the like.

The base substrate 210 may include the micro-circuit pattern 214. The micro-circuit pattern 214 may be formed on at least one surface of the upper surface and the lower surface of the base substrate 210.

The micro-circuit pattern 214 may include the thin seed layer 216. The thin seed layer 216 is formed on the base substrate 210 on which the through-hole 230 is formed. The thin seed layer 216 may be formed on at least one surface of the upper surface and the lower surface of the base substrate 210 and the inner wall surface of the through-hole 230. The thin seed layer 216 may be made of one of nickel copper (NiCu) and copper (Cu), or a mixed material which mixes nickel copper (NiCu) and copper (Cu).

The micro-circuit pattern 214 may further include the thin plate layer 218. The thin plate layer 218 is formed on the thin seed layer 216. The thin plate layer 218 is formed on the surface of the thin seed layer 216, and is, for example, copper (Cu).

The laminate may further include a bonding substrate 220 which is interposed between the plurality of base sheets.

The bonding substrate 220 is interposed between the plurality of base sheets to bond the plurality of base sheets by applying a pressure together with heat of a melting temperature or more. The bonding substrate 220 is, for example, a liquid adhesive agent which is applied to the surface of the base substrate 210 in the form of a film or a sheet.

The inside and surfaces (for example, the upper surface and the lower surface) of the laminate are formed with the micro-circuit pattern 214 as the plurality of base substrates 210 are laminated. The laminate may further include one or more through-holes 230 which electrically connect the micro-circuit patterns 214. The through-hole 230 is formed by perforating the laminate.

The connection plate layer 240 is formed on the surfaces of the through-hole 230 and the laminate. The connection plate layer 240 is formed on at least one surface of the upper surface and the lower surface of the laminate and the inner wall surface of the through-hole 230. The connection plate layer 240 electrically connects (that is, electrically conducts) the micro-circuit patterns 214 which are formed on the inside and the outside (that is, the surfaces) of the laminate.

The connection plate layer 240 may include the first connection plate layer 242. The first connection plate layer 242 is formed on the inner wall surface of the through-hole 230, the upper surface of the base substrate 210 which is laminated on the top of the laminate, and the lower surface of the base substrate 210 which is laminated on the bottom of the laminate. The first connection plate layer 242 is, for example, copper (Cu).

The connection plate layer 240 may further include the second connection plate layer 244. The second connection plate layer 244 is formed on the surface of the first connection plate layer 242. The second connection plate layer 244 reinforces the electrical connection (that is, electrical conductivity) of the first connection plate layer 242.

The printed circuit board may further include a protective layer (not illustrated). The protective layer is formed on the surfaces (that is, the upper surface and the lower surface of the laminate) of the printed circuit board. The protective layer is, for example, an organic substrate such as epoxy, polyimide, polycarbonate, or polyvinyl alcohol.

The printed circuit board may further include a terminal part (not illustrated). The terminal part is formed on the printed circuit board after partially removing the protective layer. The terminal part is a configuration for connecting the micro-circuit pattern 214 to an external circuit, and is, for example, a conductive material such as copper.

Although the preferred embodiment according to the present disclosure has been described above, it may be modified in various forms, and it is understood that those skilled in the art may carry out various modifications and changes without departing from the claims of the present disclosure.

The invention claimed is:

1. A method for fabricating a printed circuit board, the method comprising:
preparing a base substrate of which a circuit pattern is formed on both an upper surface and a lower surface;
forming a laminate by laminating a plurality of base substrates;
bonding the laminate;
forming a through-hole penetrating through the laminate; and
forming a connection plate layer on the circuit patterns on an upper surface and a lower surface of the laminate and the through-hole through a plating process,
wherein the base substrate is one selected from an organic substrate, FR-4, and Prepreg.

2. The method for claim 1,
wherein the organic substrate is one thermoplastic resin of epoxy, polyimide, polycarbonate, and polyvinyl alcohol, and
wherein the FR-4 and the Prepreg comprise a coating layer which is made of polyimide or polyamide-imide and formed on the surface of the FR-4 and the Prepreg.

3. The method for claim 1,
wherein the preparing of the base substrate comprises
forming a thin seed layer on the base substrate;
forming a thin plate layer on the thin seed layer; and
etching the thin seed layer and the thin plate layer to form a micro-circuit pattern,
wherein the thin seed layer is made of one of nickel copper and copper, or a mixed material which mixes nickel copper and copper, and the thin plate layer is copper.

4. The method for claim 1,
wherein the forming of the laminate comprises interposing a bonding sheet between the plurality of base substrates.

5. The method for claim 1,
wherein the forming of the connection plate layer comprises
forming a first connection plate layer on the surface of the laminate and the inner wall surface of the through-hole;
forming a second connection plate layer to the first connection plate layer; and
etching the first connection plate layer and the second connection plate layer to form a connection plate layer.

6. The method for claim 1,
wherein the connection plate layer is connected to micro-circuit patterns which are formed on the inside and the surface of the laminate.

* * * * *